United States Patent [19]

Miyamoto

[11] Patent Number: 4,609,820

[45] Date of Patent: Sep. 2, 1986

[54] OPTICAL SHIELD FOR IMAGE SENSING DEVICE

[75] Inventor: Yoshihiro Miyamoto, Atsugi, Japan

[73] Assignee: Fujitsu Limited, Kawasaki, Japan

[21] Appl. No.: 596,706

[22] Filed: Apr. 4, 1984

[30] Foreign Application Priority Data

| Apr. 7, 1983 [JP] | Japan | 58-61753 |
| Apr. 7, 1983 [JP] | Japan | 58-61754 |
| Apr. 8, 1983 [JP] | Japan | 58-62659 |

[51] Int. Cl.⁴ ............................................. G01J 1/00
[52] U.S. Cl. .................................. 250/338; 250/352; 250/505.1; 250/332
[58] Field of Search ............ 250/338 R, 338 SE, 332, 250/370 G, 352, 505.1

[56] References Cited

U.S. PATENT DOCUMENTS

| 3,942,008 | 5/1976 | Ave et al. | 250/332 |
| 3,963,926 | 6/1976 | Borrello | 250/332 |
| 3,996,599 | 12/1976 | King | 250/338 |
| 4,027,160 | 5/1977 | Duffield et al. | 250/339 |
| 4,360,797 | 11/1982 | Fenimore et al. | 250/505.1 |
| 4,431,918 | 2/1984 | White | 250/338 |
| 4,446,372 | 5/1984 | Gurnee | 250/352 |
| 4,485,305 | 11/1984 | Kuwano et al. | 250/338 |

*Primary Examiner*—Carolyn E. Fields
*Assistant Examiner*—Richard Hanig
*Attorney, Agent, or Firm*—Staas & Halsey

[57] ABSTRACT

An image sensing device is improved by an optical shield having a multi-aperture to provide high signal to noise ratio. The improved optical shield is provided with a plurality of shield elements forming a grid-like or cellular structure. With such a structure, the solid angle of the field of view for each sensing element becomes almost the same, resulting in the reduction of "shading". The distance between the heat shield and the array can be reduced, resulting in miniaturization of the device. Each sensing element is not shielded individually, so the pitch of the shield elements can be larger than that of the sensing elements, which allows easier and less costly fabrication of the shield.

9 Claims, 14 Drawing Figures

OPTICAL SHIELD FOR IMAGE SENSING DEVICE

BACKGROUND OF THE INVENTION

This invention relates to an optical image sensing device having an improved optical shield for an array of sensing elements, to reduce effectively the "shading effect" of the array, and more particularly, it is applicable to an infrared image sensing device (hereinafter referred to as an IR detector).

In an IR detector the impinging infrared energy is converted to electrical energy proportionally by the array of semiconductor sensing elements (hereinafter referred to as sensing elements), which works well at extremely low temperatures such as 77° K. These sensing elements of the array are arranged in a line, or over an area whose shape is usually a square or a rectangle. The IR energy emitted from the object to be observed is focused on the array by optical collecting lenses, and filtered through an infrared filtering window. The focused IR image is converted to electrical signals and processed with an electronic apparatus to be displayed on a displaying device such as a screen of a cathode ray tube.

The IR emission or radiation varies sharply with the temperature of the object. Usually, the detectable temperature difference between the object and its background, or between a portion of the object that is of interest and another portion of the object, is expected to be small, such as 0.1°~0.2° C. Recently, the sensitivity of the IR sensing elements has been improved remarkably, and the sensitivity of the individual elements has become sufficiently uniform to extract a clear image of such an object. As the result, the improvement of the signal/noise ratio has become a serious problem to be solved to obtain a high grade image. One of the sources of noise is extraneous photons intruding from outside the field of view (hereinafter denoted by FOV) of the sensing array. For the purpose of reducing the noise, an optical shield is set in front of the IR array to shield it from the extraneous IR energy and to reject it by restricting the solid angle of the FOV.

To obtain a high grade image, a uniform distribution of the impinging IR energy to each IR element is necessary as a matter of course, but with a prior art shield, this problem has been left unsolved. This problem is called "shading", which usually occurs in the marginal portion of the image.

Generally, the solid angle of the FOV of the array is defined by the ratio of the size of the aperture to the distance between the IR array and the shield. The prior art optical shield has a single aperture through which the incoming IR energy is projected, and the size of the aperture is large. Therefore, the distance between the IR array and the shield becomes large, in proportion to the size of the aperture. This does not allow a prior art IR detector to be miniaturized.

The material of prior art IR sensing elements is an IR sensing semiconductor such as mercury-cadmium-telluride, whose operating temperature is very low as stated above, so that the array is attached with low heat resistance to a base plate of a high thermal conductivity material such as copper, and insulated thermally from the outside environment by a vacuum chamber (Dewer vessel). The array is cooled through the base plate by a refrigerator arranged inside the Dewer vessel.

Sometimes this optical shield is called a cold shield, because the shield should be kept cold to reduce the IR radiation from the shield itself, which might provide the IR image with another source of noise.

The IR energy is emitted from an object to be measured, is collected by a positive lens and filtered through an IR filtering window, and impinges onto the surface of the array, after the FOV is restricted by the shield aperture.

As shown in FIG. 1 in perspective, the optical shield 7 has a single aperture 3 (opening window), with its shape depending on the shape of the array. For example, for a linear array 1 of IR elements 2, a rectangular aperture 3 is provided. The sides 3a of the rectangular window 3 that are parallel to the linear array 1 shield the sensing elements effectively from the extraneous photons outside the FOV angle, but the other sides 3b, which are transverse to the linear array 1, do not shield the array 1 effectively. It is clear that the distribution of the impinged IR energy onto the elements 2 is not uniform along the axis line X—X of the linear array, but has a peak at the center and is reduced somewhat at both sides. This is the shading referred to above. Naturally, this will result in an IR image with speckles and a partially faded background. As described before, the temperature difference to be detected is very small, so that such a noise and shading will affect the image quality of the IR detector seriously.

A counter-measure is proposed in U.S. Pat. No. 3,963,926, issued June 15, 1976, wherein an array of individual optical shields fabricated by semiconductor technology is disclosed. The advantage of this prior art is that, with this type of shield, each IR sensing element is surrounded by a shielding section of the shielding array, so the shielding itself is performed individually. This means the number of sensing elements is exactly the same as the number of the optical shield elements. By such a shielding, the shading is eliminated almost completely.

But, as the semiconductor technology progresses rapidly, the pitch of the sensing elements on the array is becoming closer, such as several tens of microns, so there remains little space between the sensing elements to set the individual shields surrounding each element. In other words, the pitch of the sensing elements of the IR array is limited by its individual shield. This results in setting a restriction on the resolving power of the IR impinging apparatus.

SUMMARY OF THE INVENTION

It is, accordingly, an object of the present invention to provide an optical image sensing device having a high quality image signal.

Another object of the present invention is to provide an IR detector with a high signal to noise ratio and practically no shading effect of the IR image.

Still a further object of the present invention is to provide an improved structure of an optical shield for an IR detector, which shields the IR array from extraneous IR energy intruding from outside the solid angle of the FOV of the array, and which provides a uniform distribution of the impinging IR energy onto the IR sensing elements of the IR array.

A further object of the present invention is to provide a compact and less costly head of an IR detector.

The above objects will be accomplished by improving the structure of the optical shield, to a grid-like or cellular structure having a plurality of apertures (opening windows) instead of the single aperture currently in use.

The improved IR detector is now briefly described. The improved optical shield is of a grid-like or cellular structure having a plurality of shield elements, such as cells, and thusly being different from the conventional one with a single aperture. The shield is supported in front of and in parallel with the array, at a specified distance H therefrom, and cooled through the outer frame of the shield attached to the base plate.

The total energy of the IR rays incident on each IR sensing element is limited by the solid angle of the FOV as viewed from the IR sensing element. The angle is determined or restricted by the geometry of the shield and the distance H between the array and the shield. If the shield element area of the optical shield has enough area to cover the array, the solid angle of the FOV of each IR element becomes the same practically, resulting in a uniform distribution of the IR energy impinging on the sensing elements and in reducing or removing the shading of the IR image.

The number of the shield elements are not required to be the same as the number of the IR sensing elements, because each IR sensing element is not shielded individually, but is provided with almost the same FOV. This is a remarkable advantage of the present invention because it provides significant freedom in design and fabrication of the shield.

DESCRIPTION OF THE PREFERRED EMBODIMENT

Figure 2:
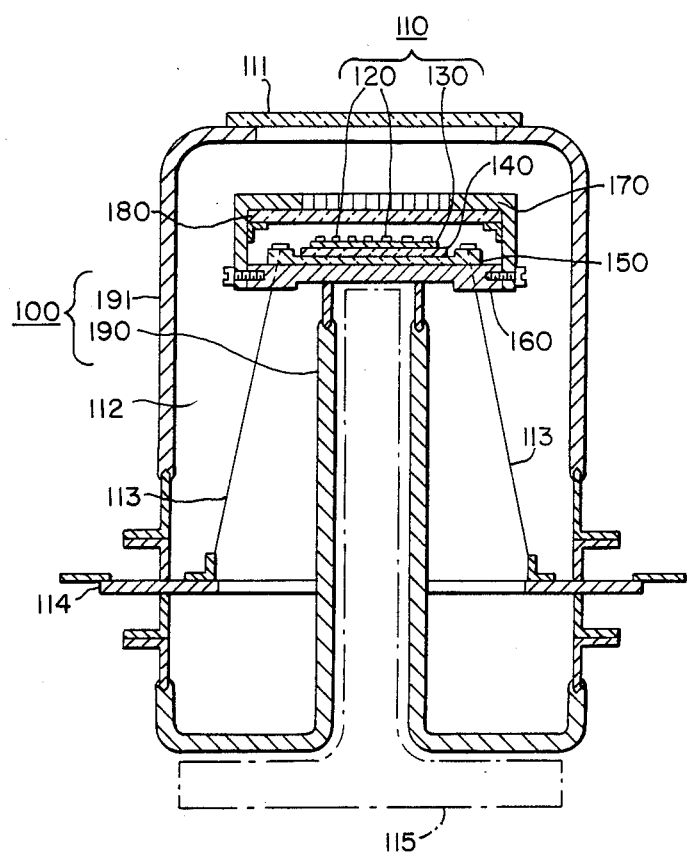
FIG. 2 illustrates a cross-sectional front elevation view of an infrared detector according to the present invention, especially showing the construction of the optical shield.

The improved IR detector is described in reference to the drawings. As described above, except for the optical shield, the construction of the detector remains unchanged from that of prior art. The cross-sectional view of a structure of an IR detector according to the present invention is illustrated in FIG. 2.

An IR sensing array 110 having several sensing elements 120 arranged in a line (linear array) or over an area (area array) is attached on a base plate 160. The sensing elements 120 are formed in a substrate 130 of an IR sensing semiconductor material such as mercury-cadmium-telluride. The substrate 130, being set on a sapphire plate 140 and a ceramic terminal plate 150, is attached on a base plate 160 (or cooling plate) which is mounted on the stem of the Dewer vessel 100. The improved shield 170 is attached to the base plate 160, which is cooled by a refrigerator 115. An IR filter disc 180 is placed inside the shield 170. This provides an IR sensing head which is thermally insulated from the environment in a vacuum enclosed by the inner glass envelope 190 (stem), outer glass envelope 191, IR window 111, etc. These envelopes have metal members and a multi-terminal ceramic disc 114, which is sealed to the glass members to form a space 112, which is evacuated at the last fabrication stage for the IR detector. The electrical signals converted by the sensing elements 120 are transmitted through the lead wires 113 and to lead terminals (not shown) radially formed on the surface of the ceramic multi-terminal disc 114 by a conventional printing method for hybrid IC technology.

The incoming IR energy (ray) is collected by a collecting lens (not shown) and focused on the array 110, after passing through the IR window 111 and the IR filter 180. The optical shield 170 limits the solid angle of the FOV (optical view of field) to shield the array 110 from extraneous IR energy as described before.

Figure 1:
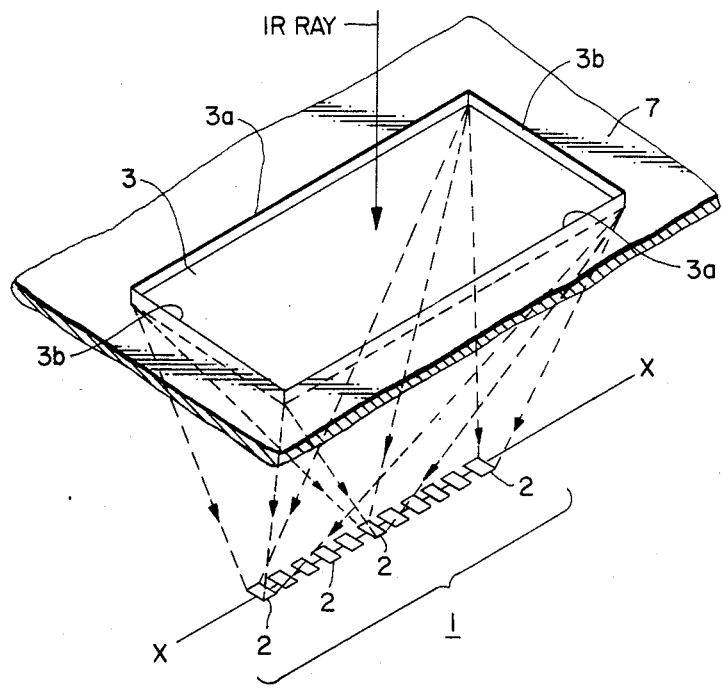
FIG. 1 illustrates a schematic perspective view of a prior art optical shield of an IR detector and an associated IR linear array indicating the solid angle of the FOV viewed from each sensing element.
Figure 3:
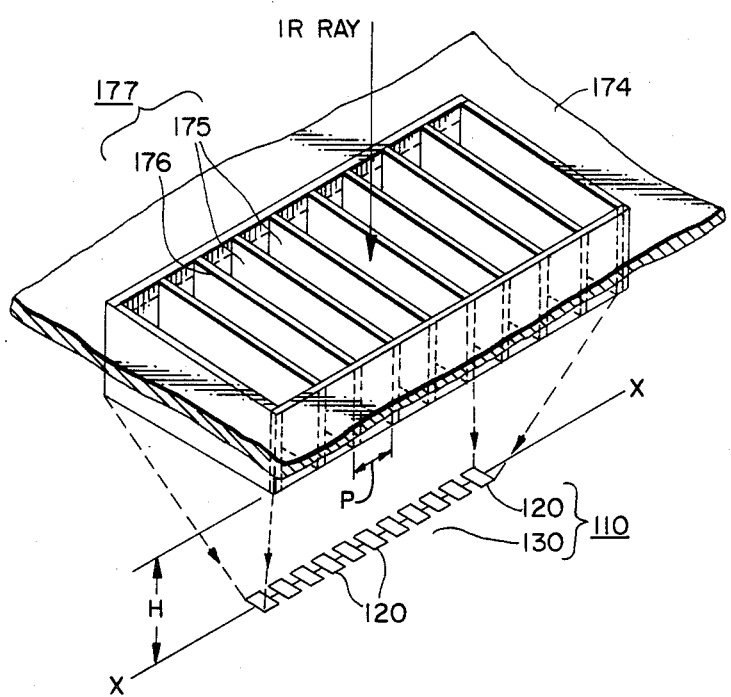
FIG. 3 illustrates a schematic perspective view of an optical shield according to the present invention and an associated IR linear array, indicating the solid angle of the FOV viewed by each sensing element.

A prior art optical shield for a liner array is illustrated in FIG. 1, and an improved optical shield according to the present invention is illustrated in FIG. 3, both schematically in perspective views. As is clearly seen from the figures, the improved optical shield 170 has several small openings 175 separated by partition walls 176. The openings 175 are surrounded by the partition walls 176 and the outer frame 174, and comprise the shield elements 177 as described above. On the contrary, the prior art optical shield has only one aperture 3, as in FIG. 1.

Figure 4:
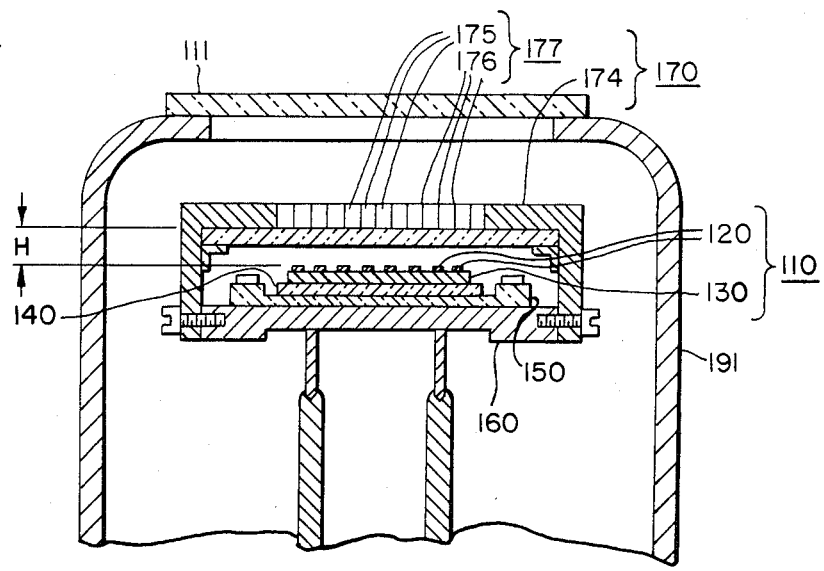
FIG. 4 illustrates a cross-sectional elevation view of an example of a head of an infrared detector according to the present invention, showing the optical system of the head and the collection lens.

In FIG. 4, a sectional view of the improved optical shield 70 is illustrated schematically. The shield elements 177 are arranged in a plane located in front of the array 110, in parallel to the array at a constant distance H. This distance H can be made much smaller than that of the prior art for the same solid angle of the FOV as viewed from the sensing array 110. This small distance H allows the size of the IR detector to be miniaturized.

Figure 5A:
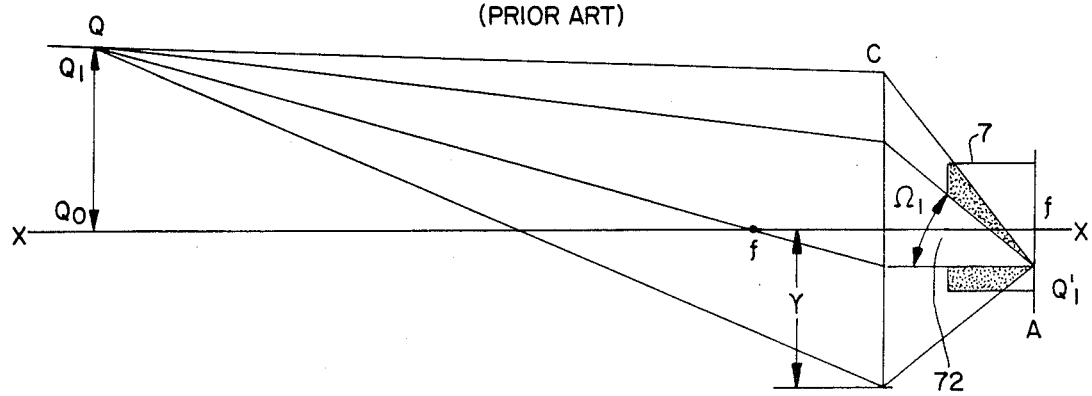
FIGS. 5(a) and (b) illustrate the optical geometry of the object and its image by the optical system with a prior art IR detector.
Figure 6A:
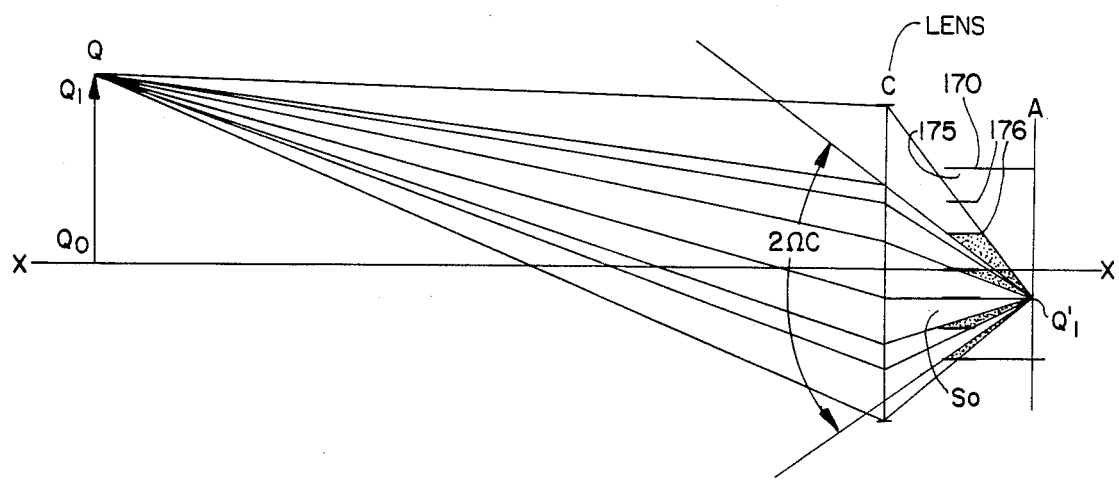
FIGS. 6(a) and (b) illustrate optical geometric figures, for the explanation of the critical solid angle of the FOV viewed from the IR array.

In order to understand the function of the optical shield, the following geometric considerations are presented in reference to FIGS. 5(a) and (b) and FIGS. 6(a) and (b), which illustrate the optical paths of the optical system for the IR detector of the prior art and in the present invention, respectively.

Figure 5B:
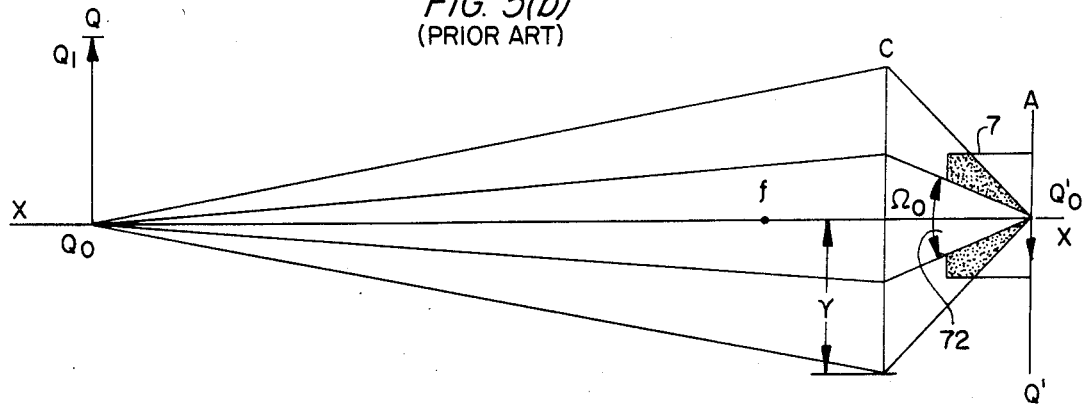

In FIG. 5(a), a collecting lens C forms an image Q' of the object Q on the focusing plane A, where the IR array is placed. Some of the rays originating from the object point $Q_1$ are shielded by the optical shield 7, while some of the rays pass through the aperture 72 in the shield 7 and reach the array at point $Q'_1$. The quantity of the rays reaching the array is proportional to the solid angle of the FOV $\Omega_1$ subtended by the point $Q'_1$. In FIG. 5(b), the point $Q_0$ of the object, positioned on the optical axis X, is imaged at $Q_0'$ and the solid angle of the FOV subtended by the point $Q_0'$ is $\Omega_0$. Thus there are different solid angles of the FOV for different points of the image $Q'$ on the focusing plane A, which is the plane of the IR array. The solid angle $\Omega_0$ is seen to be the largest, and $\Omega_1$ the smallest. Accordingly, the energy distribution of the image $Q'$ has the highest intensity at its center. This non-uniform distribution is the above-mentioned shading effect.

FIGS. 6(a) and (b) illustrate the optical system with the optical shield 170 of the improved type of the present invention. The object points $Q_1$ and $Q_0$ are imaged at the points $Q_1'$ and $Q_0'$ respectively. As described before, the aperture comprises several shield elements 176, that is, a group of small apertures. The solid angle of the FOV as viewed from a sensing element at the point $Q_1'$ is the sum of plural solid angles which are defined by each individual shield element 176. Hereinafter such separated solid angles corresponding to each shield element will be called a sub-solid angle of the FOV. Consider now the solid angle of the FOV as viewed from an IR sensing element at $Q_1'$. As easily imagined from the drawing in FIG. 6(a), the sub-solid angle of the shield element $S_0$ which is located right above the sensing element at point $Q_1'$ will provide the largest one, and the solid angles decrease for the shield elements located apart from the shield element $S_0$, and there is a critical angle of the direction of the shield element as viewed from the sensing element at $Q_1'$ at which the sub-solid angle disappears. The angle between the normal to the array plane and the critical direction described above will be defined as a critical solid angle of FOV $\Omega_c$.

Figure 6B:
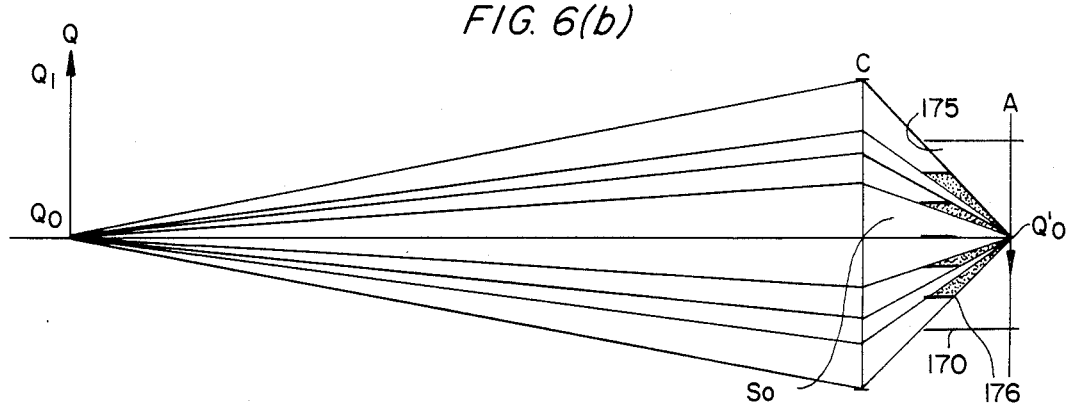

In the case shown in FIG. 6(b), the object point $Q_0$ has its image at the point $Q_0'$ and the solid angle of the FOV as viewed from the sensing element at the point $Q_0'$ remains the same as that in FIG. 6(a).

Assume that the shield elements are arranged on the plane of the optical shield to extend beyond the critical angle of the confronting IR sensing array, strictly speaking, over the critical solid angle of each sensing element and particularly those positioned at the periphery of the array. In such a case, the solid angle, that is, the sum of the sub-solid angles of the FOV as viewed from each sensing element is quite the same. This effect can be referred to as the law of similarity. So, it can be said that, in this case there is in theory no shading effect.

Figure 7:
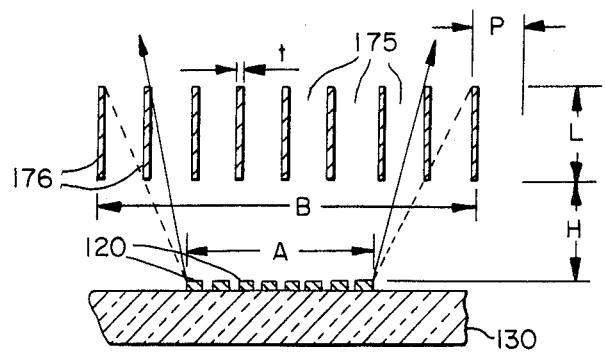
FIG. 7 illustrates the geometry of an improved optical shield according to the present invention.

The solid angle of the FOV as viewed from the IR sensing elements is defined by the length of the distance H, the depth L and the pitch P of the shield element, the total length of the array A and the total length of the shield B, as illustrated in FIG. 7 schematically, and the law of similarity is applicable.

For simplicity, the incoming IR energy distribution onto the sensing elements of a linear array will be calculated for the two dimensional optical geometric model shown in FIG. 7. This is also applicable to the optical shield for the area array system. The calculation is performed for several combinations of the dimensions of H, L, A, P and the wall thickness of the partition wall t. These dimensions are expressed in relative length. The calculated result for the prior art is also shown for reference. The ratios $\alpha$ of minimum value to the maximum value of the IR energy distribution are found as follows:

For A = 20, B = 20, H = 20;   $\alpha$ = 0.791 (prior art)
For A = 20, B = 20, H = 40;   $\alpha$ = 0.922 (prior art)

-continued

For A = 20, B = 30, H = 5,    $\alpha$ = 0.992 (present invention)
P = 1, t = 0.1, L = 0.7;

It is clear from above data that by using the optical shield according to the present invention, the impinging IR energy distribution on the IR sensing array can be very uniform, and the distance H becomes short resulting in the ministurization of the IR detector.

Now some other examples of concrete structures of the optical shield according to the present invention will be described with reference to the drawings.

Figure 8:
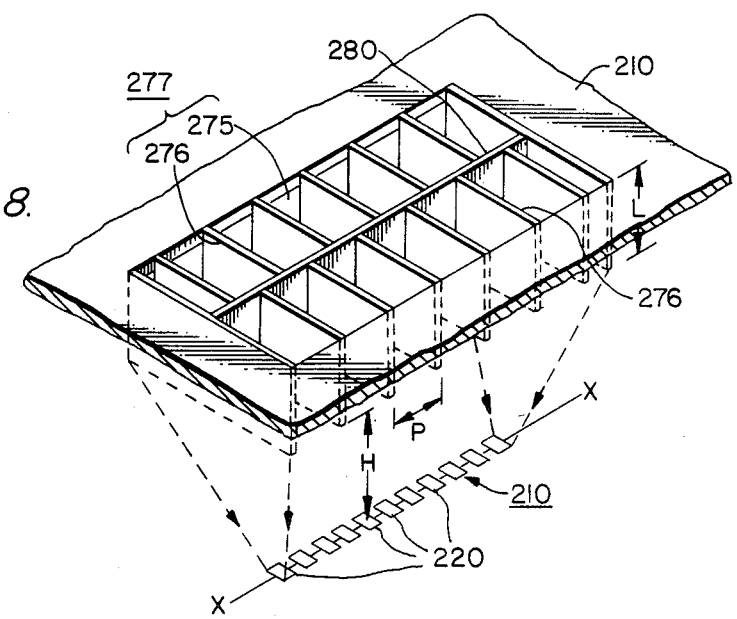
FIG. 8 illustrates in perspective a modified optical shield for a linear array.

As already stated, an improved optical shield for a linear sensing array is illustrated in FIG. 3. A further modified structure is illustrated in FIG. 8. The common feature of these optical shield structures to be mentioned is that the partition walls 176 or 276 are arranged perpendicular to the surface where the array is arranged, and that the partition walls cross the axis X—X of the linear array 110 or 210.

The optical shield shown in FIG. 8 has two trains of shield elements 277 of the same structure, adjoining side by side (this side wall is denoted by 280) with a half-pitch discrepancy with respect to each other. This discrepancy improves the uniformity of the distribution of the impinging IR energy to the array. With this construction shown in FIG. 8, the difference between the maximum and the minimum value of the energy distribution is reduced by around half compared to that shown in FIG. 3 having a single train of shield elements.

Figure 9:
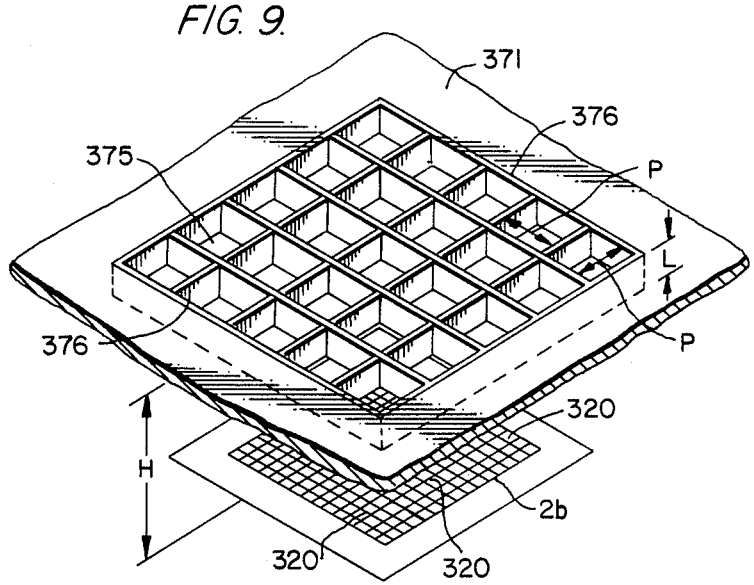
FIG. 9 illustrates a perspective view of an example of an improved optical shield for an IR detector with an area array.

The principle mentioned above for a linear array can be easily extended to the two dimensional case, that is, for an area array. An example of an optical shield array is shown schematically in the perspective view of FIG. 9. The optical geometric observation is abbreviated. A grid-like or cellular structure is adopted, with each cell being separated from the others by a partition wall 376, with individual shield elements 375. The partition walls 376 are arranged perpendicularly to the plane of the area array 320. The area of the grid-like structure of the optical shield, confronting the area array 320 with the distance H, is desirably extended outside the solid angle of the FOV of the area array 320, so as to obtain the more uniform IR energy distribution.

Figure 10A:
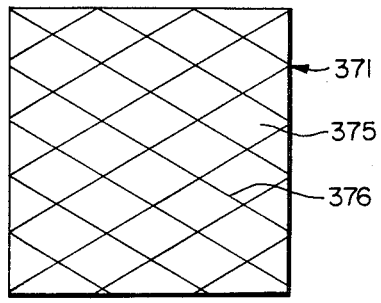
FIGS. 10(a), (b) and (c) illustrate some examples of the profile used in a cellular structure of the improved optical shield.
Figure 10B:
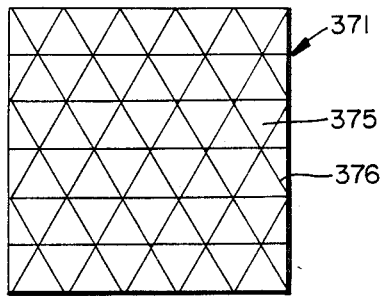
Figure 10C:
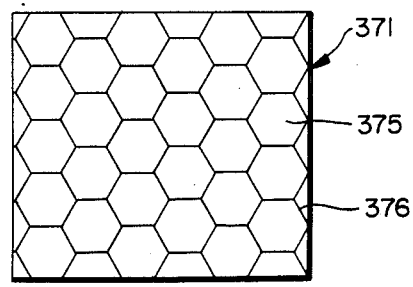

Various modifications of the profile of the cellular structure are illustrated in FIGS. 10(a) to (c). The cross-sectional profile of the individual shield elements can be a square, a rectangle, a triangle, a hexagon and the like, depending on the available fabricating technology and the necessary shielding function of the optical shield. FIGS. 10(a), (b) and (c) illustrates a parallelogram profile, a triangle profile and a honey-comb profile, respectively.

For the fabrication method of the optical shield, especially the shield element structure, various conventional technology is available and should be selected according to the preciseness and accuracy required.

For example, when the solid angle of the FOV for the IR array is required to be relatively large, the pitch P of the shield elements can be as large as 1 mm or so, more than ten times that of the pitch of IR sensing elements, and the partition wall is fabricated from a thin metal sheet by a conventional etching method, such as used for fabricating a metal mask for semiconductor fabricating process, and assembled together with the outer frame by soldering. Of course, the partition can be punched out also by conventional precise punching work.

To fabricate an optical shield of finer dimensions such as 100 μm, the conventional working method utilizing electrical discharge or a laser is available. These methods ae well-known to those who are skilled in the respective field of art, so the detail will not be described here.

The surface of the partition walls of the shield elements should have high emissivity to absorb the IR energy striking the wall surface in order to avoid multi-reflection. For this purpose also, conventional methods are applicable depending on the material of the partition wall. For example, for stainless steel, an oxidizing method is useful. The oxidation is done by heating the material in a hydrogen furnace in a moist hydrogen atmosphere. For aluminum, a conventional electrochemical or anodic oxidation is applied to form a dull surface of the partition wall. Other methods such a sooting method etc. are applicable. The emissivity should be higher than 0.5, and this value is attainable by the above-described methods. These technologies are also familiar to those skilled in the art.

As described before, the present invention is disclosed in detail in the case of infrared detectors. However it is easily understood by those skilled in the field of art that the present invention is also applicable to other optical sensing devices such as an X ray sensing device, an ultraviolet sensing device, a visible optical sensing device and the like.

What is claimed is:

1. An opto-electronic device comprising:
   an array of infrared energy sensing elements arranged in at least one line;
   a cold shield having a plurality of apertures which define a respective solid angle of field of view for each of said sensing elements;
   said cold shield being supported in front of said array at a distance H from said array;
   said apertures being separated by a plurality of partition walls;
   said partition walls being arranged perpendicularly to the surface of said array and at least selected ones of said partition walls being arranged transversely to the line of said at least one line of sensing elements; and
   said solid angle of the field of view of each of said sensing elements being defined to have a plurality of solid angle segments, by the geometry of said cold shield including the depth and the pitch of said apertures, and by said distance H between said sensing array and said cold shield, so as to provide effectively the same solid angle of the field of view for each said sensing element.

2. The device of claim 1, comprising at least two trains of said partition walls aligned in parallel with each other and transversely to at least one line of said sensing elements that is transverse to the parallel alignment of said two trains of partition walls.

3. The device of claim 1, comprising means for supporting said shield with respect to said array.

4. The device of claim 1, wherein the field of view of each said sensing element is defined by a respective plurality of adjacent ones of said apertures.

5. The device of claim 4, wherein said adjacent shield elements and said sensing elements are arranged with respective periodicities, wherein said respective periodicities are independent of each other, for providing said field of view for each said sensing element.

6. The device of claim 4, comprising a lens located in front of said shield.

7. The device of claim 5, wherein each said periodicity of said adjacent shield elements has a larger linear dimension than each respective periodicity of said array of sensing elements.

8. The device of any one of claims 1 to 7, comprising:
   each said sensing element being an infrared semiconductor sensing element;
   a base plate on which said sensing elements provide said array as an area array;
   means for cooling said sensing elements to a specified operating temperature;
   said shield comprising a grid-like or cellular structure of adjacent shield elements having a specified depth and being separated from each other by a plurality of partition walls, for defining said apertures; and
   supporting means for attaching said shield to said base plate.

9. The device of claim 8, wherein the cross-sectional profile of said apertures is selected from a square, a rectangle, a triangle, a hexagon, a parallelogram and a trapezoid.

* * * * *

UNITED STATES PATENT AND TRADEMARK OFFICE
CERTIFICATE OF CORRECTION

PATENT NO. : 4,609,820

DATED : 2 September 1986

INVENTOR(S) : Miyamoto

It is certified that error appears in the above-identified patent and that said Letters Patent is hereby corrected as shown below:

Front page, [56] References Cited, "5/1976 Ave et al." should be --3/1976 Eve et al.--.

Column 4, line 46, "70" should be --170--.

Column 6, line 10, "ministurization" should be --miniaturization--.

Column 7, line 6, "ae" should be --are--.

FIG. 5(b) should show the reference numeral 3 as follows:

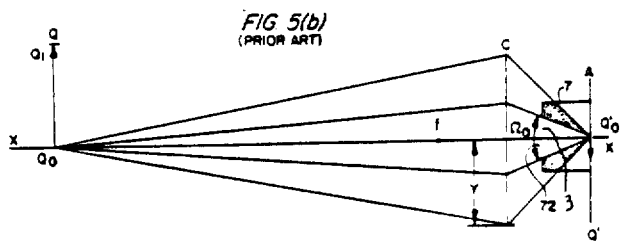

Signed and Sealed this

Twenty-third Day of December, 1986

Attest:

DONALD J. QUIGG

*Attesting Officer*     Commissioner of Patents and Trademarks